United States Patent [19]

Gladish

[11] 4,172,021
[45] Oct. 23, 1979

[54] METHOD AND GLOW-SUPPRESSION DEVICES FOR TRANSPORTING A GAS ACROSS A VOLTAGE DROP

[75] Inventor: Gary W. Gladish, Greenfield, Ind.

[73] Assignee: Western Electric Company, Inc., New York, N.Y.

[21] Appl. No.: 951,215

[22] Filed: Oct. 13, 1978

[51] Int. Cl.$^2$ ............................................. C23C 15/00
[52] U.S. Cl. .............................. 204/192 R; 204/298; 118/726
[58] Field of Search .................. 204/164, 192 R, 298; 118/49.1, 49.5; 427/34–41

[56] References Cited

U.S. PATENT DOCUMENTS

| | | | |
|---|---|---|---|
| 3,536,602 | 10/1970 | Jones et al. | 204/164 |
| 3,674,666 | 7/1972 | Foster et al. | 204/164 |
| 3,856,654 | 12/1974 | George | 204/298 |

*Primary Examiner*—John H. Mack
*Assistant Examiner*—William Leader
*Attorney, Agent, or Firm*—J. L. Landis

[57] ABSTRACT

Method and device (10) for suppressing sputtering glow in a gas to be transported across a voltage drop region (X-Y) under conditions where the gas would otherwise tend to support a glow discharge. The device includes an insulating member, such as a plastic tube (70), having a passage for transporting the gas across the voltage drop, the passage being packed with a porous insulating material, such as fiberglass strands (71), arranged so as to suppress glow discharge in the gas. Preferably, the insulating material is arranged so that there is very little pressure drop across the insulating member. In specific embodiments, the suppression device is used in a gas feed line (11) for supplying a sputtering gas, such as argon or a mixture of argon and nitrogen, or argon and oxygen, to a negatively charged cathode cell (12) of a sputtering machine (13), at very low absolute pressure.

18 Claims, 14 Drawing Figures

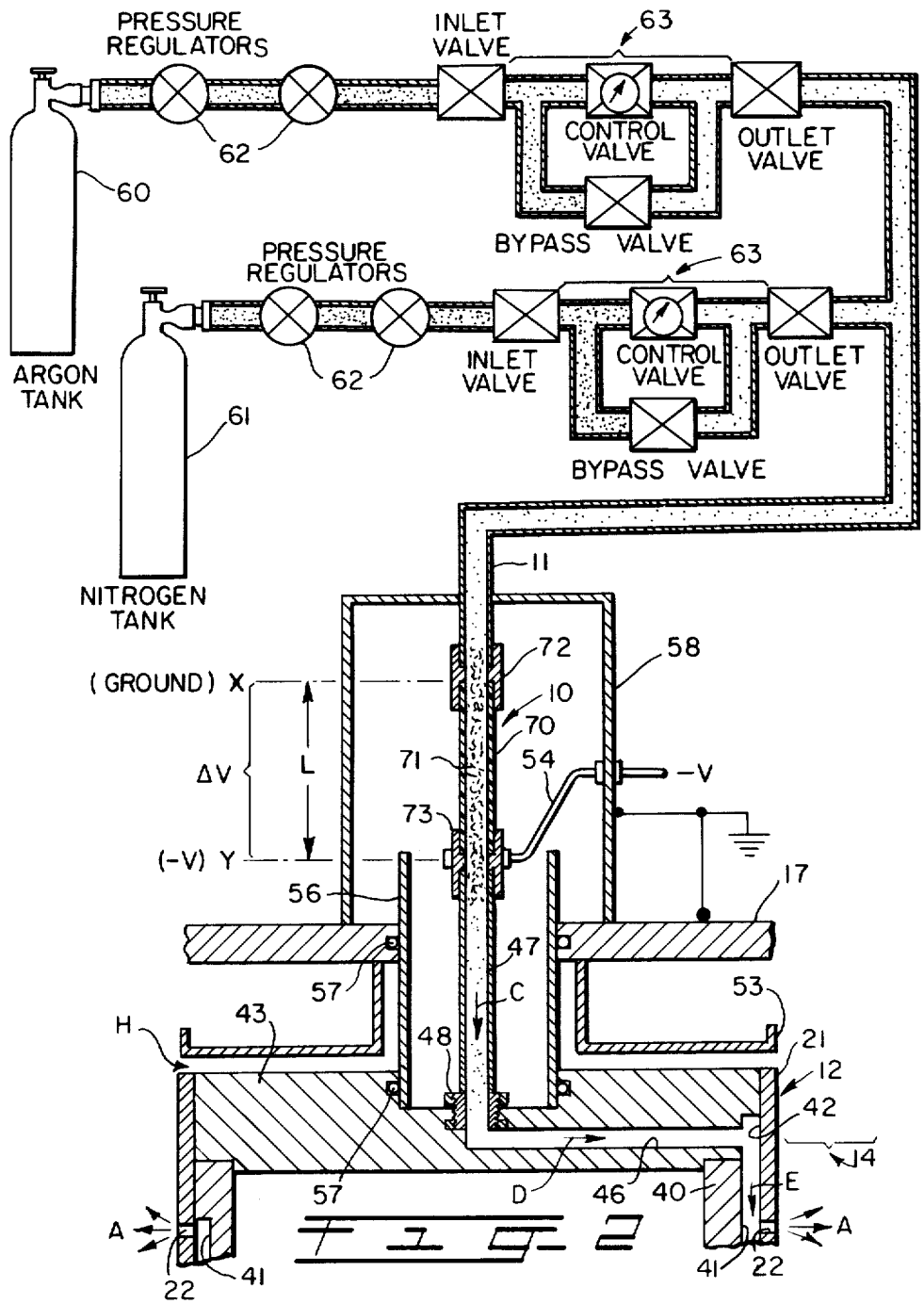

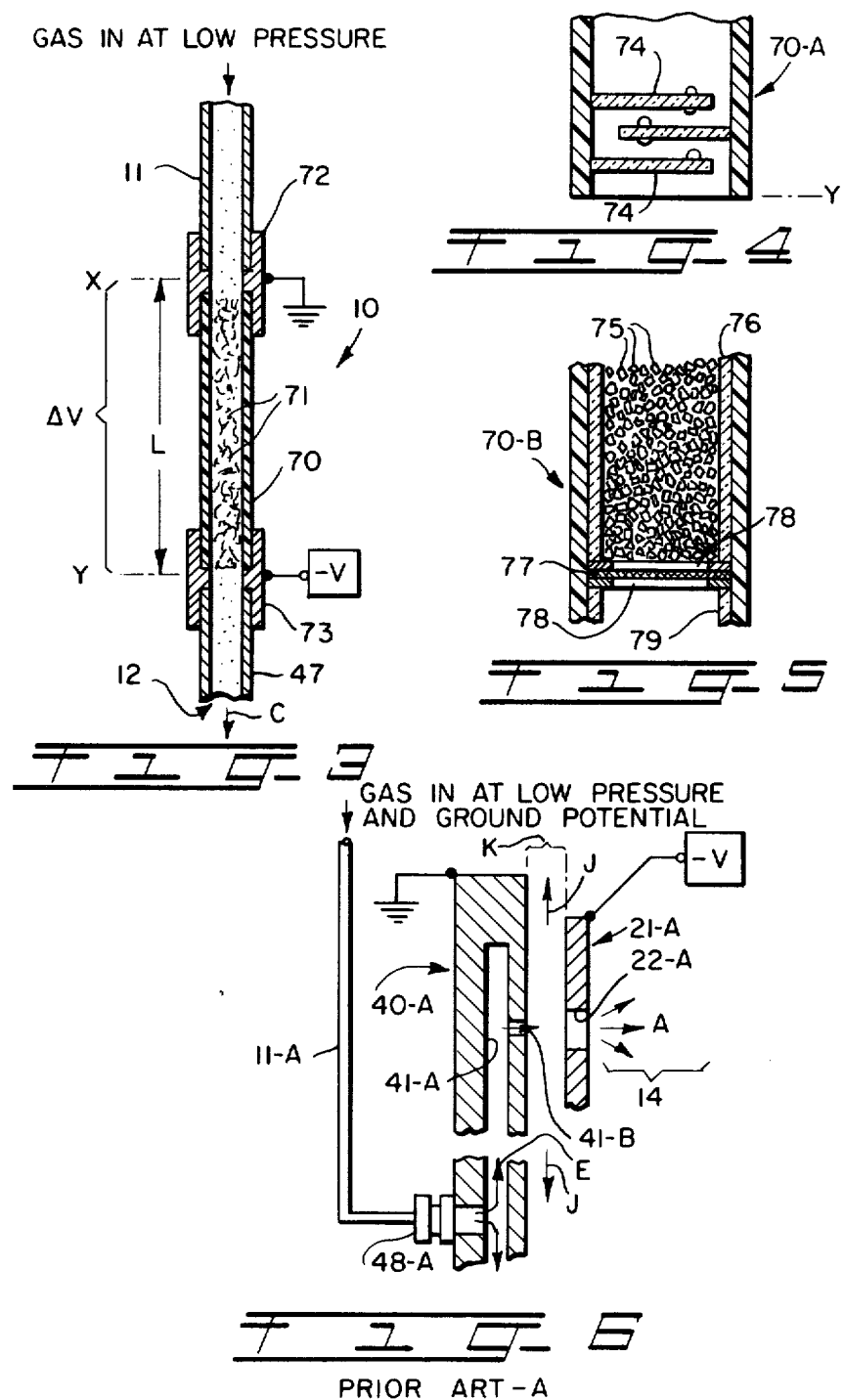

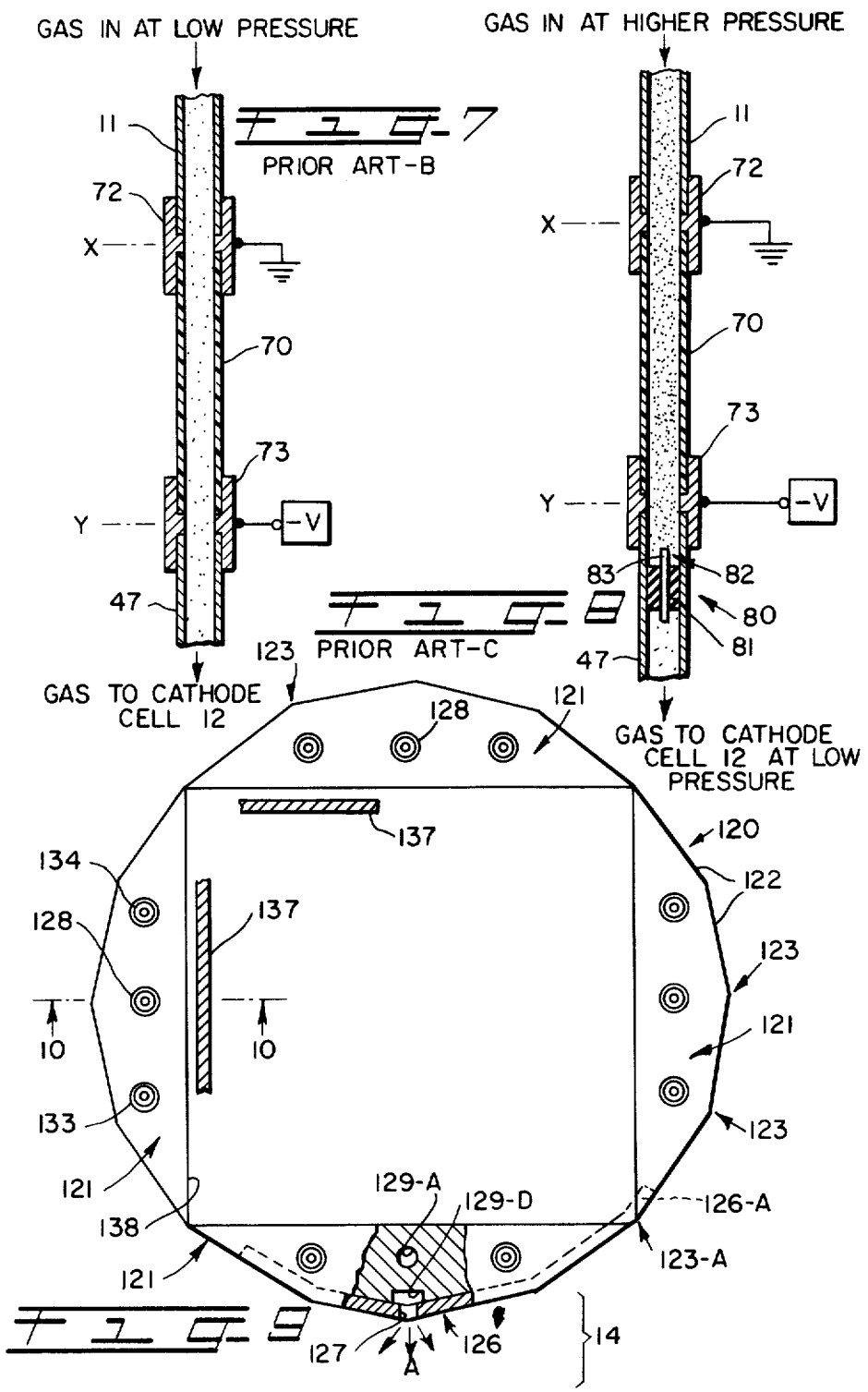

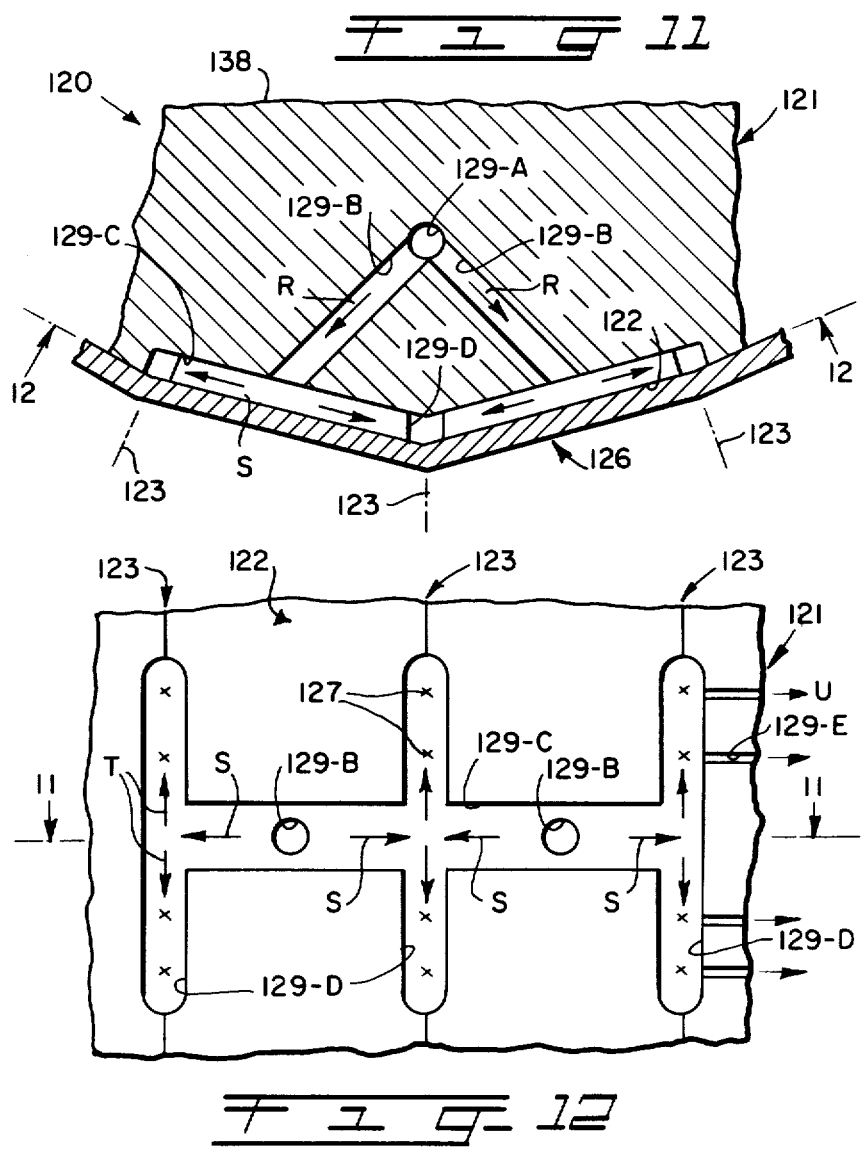

4,172,021

METHOD AND GLOW-SUPPRESSION DEVICES FOR TRANSPORTING A GAS ACROSS A VOLTAGE DROP

TECHNICAL FIELD

This invention relates generally to methods and devices for suppressing a sputtering glow in an ionizable gas or mixture of gasses, which are transported across a potential voltage difference under conditions where the gas would otherwise tend to support a sputtering glow. In a specific application, the invention relates to improved sputtering processes and equipment of the type wherein a sputtering gas, such as argon or a mixture of argon and nitrogen, is advanced from a grounded supply line to a cathode cell input line at high negative potential and low absolute pressure. In this context, the invention relates to improved methods and devices for suppressing glow in such gas supply lines for high-voltage sputtering equipment.

BACKGROUND OF THE INVENTION

In C. H. George U.S. Pat. No. 3,856,654, herein incorporated by reference, there is disclosed one particular type of sputtering machine of background interest, having a cylindrical sputtering chamber within which a perforated cylindrical cathode ring is mounted so that a sputtering gas is ejected through apertures in the cathode ring into the sputtering chamber toward an array of substrates to be sputtered. In certain modified versions of the George machine described in some detail hereafter under the heading "PRIOR ART - (B)," the sputtering gas is advanced through a series of interconnecting ducts within the walls of a negatively charged cathode cell assembly, including a perforated cathode ring integrally connected thereto and forming the outer surface thereof.

In any such machine, where the sputtering gas is to be advanced from a grounded supply line to a cathode cell input line at high negative voltage and low absolute pressure, a problem arises with unwanted sputtering glow which is established in the gas supply line at the region of voltage drop that must necessarily occur in the region between the grounded supply line and the charged cathode input, as discussed in some detail hereafter under the heading "PRIOR ART - (B)."

Certain prior art solutions to this problem, using a capillary tube in the supply line, have not been entirely successful as described hereafter under the heading "PRIOR ART - (C)."

A specific object of the invention is to provide an improved glow suppression device and method for sputtering machines of the general class in which the sputtering gas must be transported from a grounded supply line to a charged cathode cell.

More general objects are to provide improved glow-suppression devices and methods for any system wherein an ionizable gas or mixture of gasses is to be transported across a potential voltage difference under circumstances where the gas would otherwise tend to support a sputtering glow.

SUMMARY OF THE INVENTION

With the foregoing and other objects in view, a glow-suppression device and method in accordance with certain features of the invention is used to transport an ionizable gas, such as argon or a mixture of argon with nitrogen, across a voltage drop under circumstances where the gas would otherwise tend to support a sputtering glow. The gas is passed through an insulating member, such as a plastic tube, located at and defining the region of the voltage drop. The gas passage in the insulating member is packed with a porous insulating material or means, preferably strands of fiberglass insulation, for suppressing sputtering glow in the member.

In accordance with certain specific embodiments of use for the invention, an improved sputtering process and machine is characterized by the connection of a glow-suppression device as described in the preceding paragraph between a grounded sputtering-gas supply line and a negatively charged cathode-cell input line at low absolute pressure, so as to suppress sputtering glow in the supply line at the region of voltage drop between the supply line and the cathode cell, and preferably with very little pressure drop across the glow-suppression device.

Other objects, specific advantages and features of the invention will become apparent from the following detailed description of specific embodiments and examples of the invention and its use in improved sputtering systems.

BRIEF DESCRIPTION OF THE DRAWINGS

In the drawings,

FIG. 2 is a partially schematic diagram of a gas feeding and distribution system for the sputtering machine of FIG. 1, taken partially in vertical section along line 2 2 in FIG. 1 and illustrating a glow-suppression device in accordance with a first specific embodiment of the invention.

FIG. 3 is a partially schematic drawing of the glow-suppression device illustrated in FIG. 2.

FIGS. 4 and 5 are views similar to a portion of FIG. 3, illustrating alternative embodiments of glow-suppression device.

FIG. 6 is a vertical section, similar to a portion of FIG. 2, of a cathode assembly and gas-feed system for a prior-art machine of the type described in the George patent.

FIGS. 7 and 8 are views, similar to FIG. 3, of gas-feed systems for two additional prior-art machines.

FIG. 9 is a plan view of a second embodiment of cathode cell with which the invention may be used, looking along line 9—9 of FIG. 10 and partly in section along line 9A—9A of FIG. 10.

FIG. 11 is an enlarged, fragmentary central horizontal section along line 11—11 of FIG. 10.

FIG. 12 is a layout view along line 12—12 of FIG. 11, illustrating portions of the outer surface of a cathode cell block used in the second embodiment.

DETAILED DESCRIPTION

Figure 1:
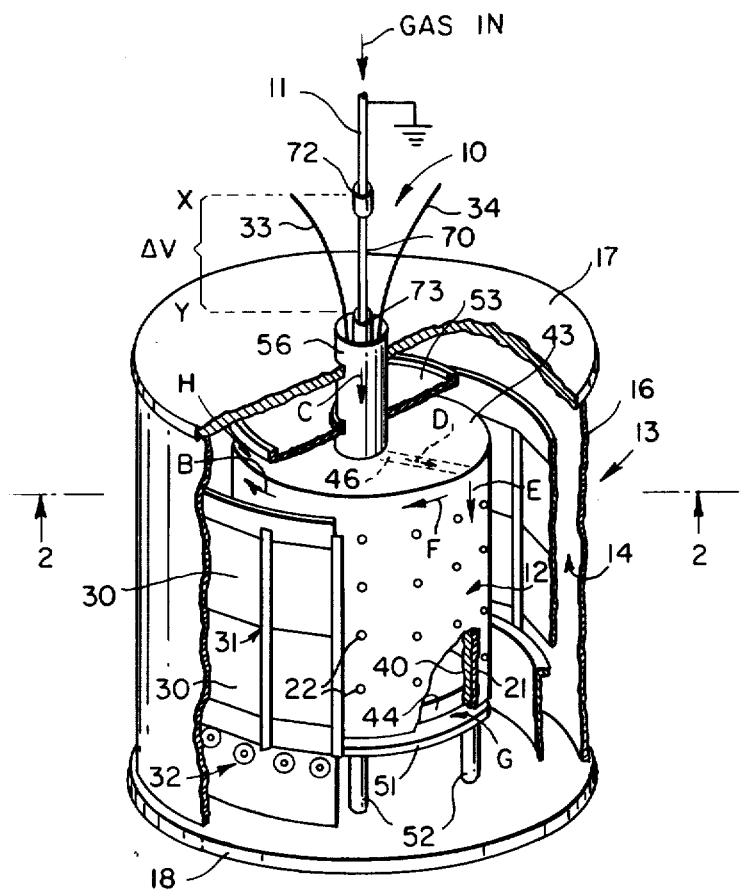
FIG. 1 is a perspective view of a first embodiment of a sputtering machine with which the invention may be used, portions being broken away to illustrate structural details.

Referring now in detail to the drawings, and particularly to FIGS. 1 and 2, a specific embodiment of this invention relates to an improved process and glow-suppression device 10 for feeding a sputtering gas, such as argon or a mixture of argon and nitrogen, across a potential drop region X-Y, from a grounded supply line 11 to a negatively charged cathode assembly or cell 12 of a generally conventional sputtering machine 13 having a sputtering chamber 14 that is maintained at very low absolute pressure. The principal object is to suppress ionization of the sputtering gas, or "sputtering glow," that otherwise tends to develop in the gas feed line 11 in the voltage drop region X-Y during certain types of sputtering processes, as will be described in detail hereafter.

General Principles—Sputtering Process and Equipment

While the invention may be used with many different types of sputtering equipment, it is preferably used in conjunction with a cylindrical sputtering machine 13 of the general class described in the George U.S. Pat. No. 3,856,654 and illustrated in part in FIGS. 1 and 2, but with various modifications discussed hereafter. Various specific details of construction of the sputtering equipment that are not specifically related to the present invention are not shown or described in detail herein, but may be constructed in accordance with the George patent.

The sputtering machine 13 in accordance with the first specific example of use of the invention includes an outer cylindrical aluminum ring or wall 16 (FIG. 1), mounted between a top plate 17 and a bottom plate 18 in a sealed, vacuum tight relationship so as to define a closed cylindrical space, comprising the sputtering chamber 14, which is continuously pumped to a very low absolute pressure, such as ten microns of mercury ($10^{-2}$ torr) in a typical example of operation, as is well known in the art.

The cathode assembly or cell 12 is mounted in the center of the chamber 14, and includes an outer cylindrical cathode ring 21 of tantalum or other metal to be sputtered. The ring 21 is formed with an array of minute discharge apertures 22, for permitting flow of sputtering gas from the feed line 11 through ductwork within the cathode cell 12 and into the chamber 14, as depicted by arrows A in FIG. 2. As illustrated in FIG. 1, the apertures 22 are arranged at spaced positions around the periphery of the cathode cell 12, so as to feed the sputtering gas into the chamber 14 in a plurality of outwardly directed streams at desired locations, as will be described in further detail hereafter.

A plurality of substrates 30 to be sputtered, such as rectangular ceramic substrates, are positioned in the chamber 14 at spaced locations facing the cathode ring 21 and the apertures 22. In the specific embodiment illustrated, the substrates are mounted in a grounded, carousel-type, indexable cage assembly 31, generally as described in the George patent. In a typical example, the substrates 30 are mounted in the cage 31 in an array of vertically stacked columns of two substrates each, arranged around the periphery of the chamber 14 near the outer wall 16; for example, sixteen columns of two substrates each arranged at $22\frac{1}{2}°$ intervals around the periphery of the chamber 14. As illustrated in FIG. 1, the gas-discharge apertures 22 are arranged around the periphery of the cathode assembly 12 so that two of the apertures face each substrate 30 in the array, at each sputtering position around the chamber 14.

The cage assembly 31 is mounted on a fixed roller assembly 32, mounted at the bottom of the chamber 14, so that the cage assembly 31 may be intermittently rotated or indexed (arrow B in FIG. 1) in a series of steps to move the substrates 30 to a succession of different positions around the chamber 14 to achieve uniform sputtering of the films. Preferably, mechanisms are provided, such as described in the George patent, for feeding the substrates 30 into the chamber 14 at one position, and later removing them when sputtering has been completed.

To cool the equipment, a cooling water input line 33 is preferably provided at the top of the cathode cell 12 to circulate cooling water through the interior of a hollow cathode cell 12 as described in the George patent, or preferably through ductwork (not shown) in the cell walls. A water return line 34 is provided for exit of cooling water. Also, the outer surface of the outer chamber wall 16 may be surrounded with water cooling coils, as described in the George patent, or cooling water circulated through ducts in that wall.

Cathode Cell 12—First Embodiment

Referring to FIGS. 1 and 2, a cathode cell 12 in accordance with the first specific embodiment of use of the invention includes a hollow cylindrical core member 40 of a conductive metal, such as aluminum, about which the tantalum cathode ring 21 is fastened and electrically connected thereto. Preferably, the cathode ring 21 is initially formed as a thin rectangular sheet of metal, which is then wrapped about the core 40 and bolted thereto so as to form a unitary cathode cell assembly 12 consisting of the conductive core 40 and the outer ring 21 of the metal to be sputtered. The ring 21 may be replaced when needed as the metal is used up in the sputtering process.

As illustrated in FIG. 2, the outer surface of the core 40 is formed with a pattern of interconnecting grooves or ducts 41, for example as generally described in the George patent, arranged to carry the sputtering gas from an inlet opening 42 at the top of the cell to the various discharge positions 22 around the periphery of the cell 12, as previously described in connection with FIG. 1. When the core 40 is wrapped with the cathode ring 21, the ring 21 closes the ducts 41, except for the discharge positions defined by the apertures 22. In reactive sputtering with a mixture of gasses, such as argon and nitrogen, the gasses are thoroughly mixed in the supply tube 11, and in passage through the ducts 41, around the cathode cell 12, to the array of discharge orifices 22; and the provision of multiple apertures 22 arranged as shown provides for thorough mixing and uniform distribution of the gasses at all sputtering locations around the chamber 14, generally as described in the George patent.

The core 40 is fitted with a top plate 43 and a similar bottom plate 44, (shown fragmentarily in FIG. 1) secured thereto so as to define a unitary closed hollow cylinder, within which the cooling water may be circulated as described in the George patent. The top plate 43 is formed with a lateral passage or duct 46 for carrying the sputtering gas from a metal inlet pipe 47 (FIG. 2) at the top of the cell 12, to the inlet opening 42 at the top of the core 40 of the cell, so that the gas is uniformly mixed and distributed around the cell in accordance with arrows C, D, E, F in FIGS. 1 and 2. The pipe 47 is mounted to the top plate 43, and connected to the lateral duct 46 by a conventional metal fitting 48.

The cathode cell 12 is preferably mounted by a plurality of insulating ceramic support members (not shown) on a grounded support plate 51 (FIG. 1), which also serves as a bottom ground plane to eliminate sputtering in a small space G between the bottom of the cell 12 and the plate 51. The plate 51 is supported on the bottom plate 18 of the machine 13 by legs 52—52. This mounting effectively insulates the negatively charged cathode cell 12 from the grounded walls of the chamber 14. A top ground plane 53 is mounted to the top plate 17 of the chamber 14 in a position spaced a short distance H from and overlying the cathode cell 12, so as to suppress sputtering glow in the region between the top of the charged cathode cell 12 and the grounded top plate 17.

The cathode cell 12 is charged to a suitable sputtering potential, such as −550–600 volts in a typical example of reactive, magnetron sputtering of tantalum, in any suitable fashion, such as by an insulated power lead 54 (FIG. 2) connected between a source of sputtering potential (−V) and the metal gas inlet pipe 47 at the top of the cathode cell. Alternatively, the power source may be connected to one of the water pipes 33 or 34 (FIG. 1), or in any other suitable fashion to the top of the cell 12. The other parts of the sputtering machine 13 are all grounded in conventional fashion, as previously described. The cathode cell is surrounded by ground planes, such as 51 and 53, in those regions where sputtering is not desired, so that sputtering takes place only in those areas of the chamber 14 between the charged cathode cell 12 and the grounded substrates 30.

The cathode cell 12 is provided with an insulating glass sleeve or column 56 at the top, through which the cooling water lines 33 and 34 and the gas inlet pipe 47 pass. The column 56 is mounted to the top of the cell 12 and to the top plate 17 of the sputtering machine 13 in conventional O-ring seals 57—57. A grounded safety cover 58 (FIG. 2) is secured to the top plate 17 at the top of the equipment, and encloses the water, gas, and power connections to the cathode cell 12, the cover 58 being omitted in FIG. 1 to illustrate details of the assembly.

Gas-Distribution System

Referring now to FIG. 2, for "reactive sputtering," for example tantalum doped with nitrogen (or oxygen in some processes), a mixture of sputtering gasses, such as argon mixed with 20% by weight nitrogen, is to be fed into and through the charged cathode cell 12 and ultimately ejected into the sputtering chamber 14 at a very low absolute pressure, such as ten microns of mercury in a typical example.

To accomplish this, the gasses are fed from individual supply tanks, such as 60 and 61 in a typical nitrogen-doping process, under positive pressure, through a series of individual pressure regulators 62—62 and a set of individual flow-control valves 63—63, arranged as shown in FIG. 2, and connected to the common grounded metal supply line or pipe 11, containing a mixture of the gasses at a very low pressure, very close to the sputtering pressure. The inert gas (argon) flow rate is determined by the speed of the vacuum pump for the chamber 14, whereas the doping gas (nitrogen or oxygen) is consumed in the sputtering process and the flow rate is determined primarily by the sputtering process parameters. The gas supply line 11 serves as a grounded input supply line to convey the gasses to the glow-suppression device 10 in accordance with the present invention, which in turn transports the gasses across the voltage drop X-Y to the charge inlet pipe 47 at the top of the cathode cell 12.

Glow-Suppression Device 10—First Embodiment

Referring to FIGS. 2 and 3, a glow-suppression device 10 in accordance with one specific embodiment of the invention includes an electrically insulating member, such as a nylon tube 70, connected between the grounded gas supply line 11 at plane X and the negatively charged cathode input line 47 at plane Y, the tube passage being packed with a porous electrically insulating material, such as fiberglass strands 71, for suppressing sputtering glow in the tube 70 in the region X-Y of potential drop between the supply line 11 and the cathode cell 12.

The tube 70 is preferably formed of a vacuum-grade insulating tubing, for example a length of nylon tubing having a $\frac{3}{8}$ inch (approximately 1 cm) outside diameter, $\frac{1}{4}$ inch inside diameter (0.6 cm), and 6 inches long (15 cm) in a typical operating example. The porous insulating medium preferably comprises loose strands 71 of fiberglass insulation of the type commonly used in home construction sidewall insulation, the strands being packed fairly tightly into the tube 70. The tube 70 is preferably connected at its upper end by a conventional fitting 72 (at plane X) to the grounded metal input supply line 11, and at its lower end by a similar fitting 73 (at plane Y) to the metal cathode input pipe 47, at a potential very close to the sputtering potential (−V), for example −600 volts in a typical operating example.

Theory of Operation

While the principles of operation of the glow-suppression device 10 may not be entirely understood, and applicant does not intend the application to be limited in any way by any particular theory of operation, it is believed that the individual fiberglass strands 71 serve to intercept the majority of electrons thermally ejected from the cathode assembly 12 into the tube 70 before they can be accelerated sufficiently to create sufficient ionization of the gas to establish a sputtering glow in the gas.

In any environment where a gas such as argon at low pressure exists within a sufficient electric field, such as the voltage drop region X-Y, electrons are released from the most cathodic surface (in this case, primarily from the cathode inlet pipe 47) by random thermal ejection and are accelerated away from the cathode surface (plane Y) by the repulsive force of like charges, toward the more positive region (grounded plane X at the top of the tube 70). If the line of movement of the accelerated electrons is not impeded for a particular length of travel (as occurs intentionally in the sputtering region 14 between the cathode ring 21 and the grounded substrates 30), the electrons attain sufficient kinetic energy such that, when an accelerated electron collides with an argon atom, the force of collision strips an electron from the argon atom (ionizes it), leaving two free electrons and a positively charged argon ion. The positively charged argon ion is then accelerated toward the cathode surface by the attractive force of dissimilar charges (thereby causing sputtering of metals such as tantalum in the chamber 14), and the two free electrons are reaccelerated by the electric field and collide with other argon atoms so as to set up an electron multiplication phenomenon, or chain reaction of ionization of the gas, referred to herein as "sputtering discharge" or "glow," as is well known in the art.

As is also well known, sputtering glow will occur only within a limited range of process parameters, depending on the voltage drop, type of gas, pressure, length (L, FIG. 3) across the voltage gap, magnetic field, etc. Unless the chain reaction as discussed above can occur, the glow is not self-sustaining and will be rapidly extinguished. When an electron first leaves the cathode surface, it does so at a slow speed and then is accelerated to a high speed by the repulsive force of like charges. If the electron collides with a gas molecule while it is still moving slowly, it will not have sufficient energy to produce ionization. It will then lose its momentum and have to be reaccelerated. At a high relative pressure, the mean free path of an electron in argon is relatively short. Consequently, a relatively high voltage gradient is required to impart sufficient kinetic energy between collisions to produce ionization upon collision.

As the argon pressure increases, the mean free path of the electron will decrease. This would require greater and greater electric fields in order to impart sufficient energy to the electron to produce ionization upon collision. High pressure thus present a limitation to the sputtering process.

Physical shields or very low pressures also present limitations to the sputtering process. At a pressure of 10 microns of mercury (a pressure within the usual range for sputtering), the mean free path of a free electron in argon is approximately 4 centimeters. If a grounded plane (such as 51 or 53 in FIGS. 1 and 2) is placed closer to the cathode than this spacing, then the electron will be absorbed by the ground plane before it can collide with and ionize an argon atom. This would, of course, extinguish the glow. As the pressure is lowered, the mean free path of the electron is increased, and greater spacing is required between the cathode and grounded objects to assure the opportunity of an ionizing collision. The placing of ground planes and other conductive shields near the cathode surface in order to suppress the glow in certain areas has long been an established practice in sputtering environments. Also, the cathode to anode spacing required to establish a sputtering glow at a given pressure may be substantially altered by the presence of a magnetic field.

To apply the above general theory of suppression of a sputtering glow in gasses to the operation of the glow-suppression device 10, it may be helpful to think of the individual fiberglass strands 71 as substitutes for the gas molecules. When the thermally ejected electron is accelerated by the electric field, it normally collides with a fiberglass fiber 71 before it attains sufficient energy to create ionization. If the length of the device 10 is "L" (the distance from charged plane Y to ground plane X), the voltage impressed on it is "V," and the ionization potential of the gas is "P," then the maximum distance "d" between fibers that would still assure that no ionizing collisions occurred can be found by:

$$d/L \leq P/V.$$

In the particular case in question:
L = 6 inches (approximately 15 cm)
V = 600 volts
P = 15 volts,
so that d ≤ 0.15 inch (approximately 0.38 cm).

As long as the glass fibers 71 are packed close enough so that no line of sight paths of 0.15 inch or longer exist, no sputtering can occur because no electron can be accelerated to a kinetic energy great enough to cause ionization.

In the preferred embodiment of the device 10, the glass fibers 71 are packed many times tighter than necessary to suppress the glow at 600 volts, and this device should be sufficient to suppress the glow at several thousand volts. By varying the packing density and the device length, the glow suppression device 10 can be tailored to a wide range of voltages while maintaining relatively low flow restrictions and thus very little pressure drop across the tube 70.

Glow-Suppression Devices—Alternative Embodiments

From the above explanation, it should be apparent that, while the use of densely packed glass fibers 71 is preferred for the porous insulating material to be packed into the tube 70, various other arrangements are possible, the main principle being to prevent substantial line of sight paths for electrons longer than that required to establish any substantial glow in the tube under the particular process parameters involved. For example, FIG. 4 illustrates an alternative embodiment of the invention where a plastic or glass tube 70-A is provided with a maze of shelves or projections 74 of a suitable insulating material such as glass, ceramic or plastic, spaced to suppress sputtering glow while not greatly impeding flow of the gas through the tube.

FIG. 5 illustrates another alternative arrangement, in which a plurality of insulating ceramic particles or pieces 75 are packed into an insulating tube 70-B, for the same purpose. In one example of this construction, a ceramic sleeve 76 was inserted into a nylon tube 70-B, for holding the pieces 75, and a piece of metal screening 77 was fitted at each end of the sleeve 76, for retaining the pieces 75 in the tube 70-B. Each screen 77 was sandwiched between two metal washers 78—78, which were inserted into the end of the tube 70-B against the end of the sleeve 76 and locked in place by a short section of ceramic tube 79 inserted into the end of the nylon tube 70-B to act as a plug or stop. In one example of this type of construction, a plurality of the ceramic substrates 30 used for sputtering were smashed, and the medium sized pieces or fragments 75 (20 to 40 mil widths) resulting were packed into the sleeve 76.

Preferably, in all of these variations of insulating member or tube 70 packed with porous insulating material, such as glass fibers 71 (FIG. 3), projections 74 (FIG. 4), or ceramic pieces 75 (FIG. 5), the packing density is such as not to materially impede the flow of sputtering gas through the tube 70, so as not to create a region of substantially higher pressure at the inlet end (X) of the tube 70 than the outlet end (Y). It is preferred to have as little pressure drop as possible across the tube 70, and in the entire feed line system 11 from the cathode cell 12 back to the control valves 63—63 (FIG. 2), for reasons explained hereafter in the section "PRIOR ART - (C)." The insulating member, such as tubes 70, 70-A, or 70-B, may be of any suitable electrical insulating material, such as glass, ceramic, or various plastics, including nylon.

PRIOR ART—(A) George U.S. Pat. No. 3,856,654

As previously explained in some detail, the George patent discloses a first (or "A" model) version of a cylindrical sputtering machine of the general class under consideration herein, including a cylindrical sputtering chamber (such as 14 in FIG. 1 of this application), a perforated cathode ring corresponding in function to the ring 21 herein; and substrates 30 mounted on an indexable carrier 31 for stepwise rotation about the cathode ring 21. Some specific details of structure described in the George patent were later changed, particularly the cathode assembly as described hereafter, but the general principles of the sputtering process are the same except for the method of feeding the sputtering gas into and through the cathode assembly to the sputtering chamber 14.

FIG. 6 is a sectional view illustrating a portion of the George A cathode assembly and gas-feed system, corresponding generally to FIG. 4 of the George patent and related functionally for comparison purposes to the corresponding portions of FIG. 2 of this application. (All reference and figure numerals in the following paragraphs refer to part numbers and figures in the drawings of this application, not the George patent. Also, certain dimensions have been exaggerated somewhat in FIG. 6 to illustrate functional relationships.)

Referring to FIG. 6, in the Model A George machine, the tantalum cathode ring 21-A was not physically or electrically connected directly to a central cylindrical aluminum core member 40-A, which was grounded as shown in FIG. 6. The sputtering gas was advanced at low pressure through corresponding ductwork 41-A in the grounded core 40-A (arrow E) as described in the patent, and then ejected through small apertures 41-B in the outer surface of the core and thence outward through corresponding ports 22-A in the cathode ring 21-A to the sputtering chamber 14, as indicated by arrows A in FIG. 6. The ports 22-A were essentially the same in layout and arrangement as the ports 22 in FIG. 1, as described above.

In the George A machine, the gas was fed from a supply line 11-A and through a fitting 48-A connected to the ducts 41-A in the core 40-A, all at ground potential. Thus, there was no problem with sputtering glow in the supply line 11-A, since there was no potential drop in the supply line and thus no need for any type of glow-suppression device.

In certain types of sputtering processes (such as reactive sputtering), problems were encountered with the George A machine, among them: (1) that a sputtering gas mixture, such as argon plus nitrogen was not distributed as evenly as hoped; (2) that the cathode (21-A) could not be cooled as well as desired; and (3) that uncontrolled amounts of the gas escaped vertically (arrows J—J) through an open space K necessarily left between the grounded core 40-A and the charged cathode ring 21-A, so as to interfere with the desired flow rate through the cathode apertures 22-A and to alter the distribution pattern of sputtering gas in the chamber 14. (The spacing K is exaggerated in FIG. 6 to illustrate the principles.)

PRIOR ART—(B) George Model B Machine

In view of these and other problems, George and co-workers developed an improved machine, referred to herein as "Model B" and also constituting prior art with respect to the present United States patent application. In the Model B machine, the cathode ring 21 was wrapped about and electrically connected to a central core member, such as element 40 in FIGS. 1 and 2 of this application, so as to form a unitary cathode assembly 12, as described herein under the heading "Cathode Cell 12 - First Embodiment." Apart from the provision herein of the improved glow suppression device 10, FIGS. 1 and 2 essentially illustrate the George B machine.

FIG. 7 illustrates generally schematically, corresponding to FIG. 3 to the extent applicable, the earliest gas feed system for the George B machine. As illustrated in FIG. 7, a plastic tube 70 and fittings 72-73 were used, generally as in FIGS. 2 and 3, to connect a grounded gas input line 11 to a charged cathode inlet pipe 47, with a voltage drop of, for example, 6000 volts established between the opposite ends X-Y of the tube 70 in that particular use in D.C. sputtering.

In this configuration, a sputtering glow or discharge became established in the tube 70 between the cathode cell 12 and the grounded supply line 11 whenever voltage was applied to the cathode, and the tube 70 lit up like a neon light. Such a sputtering glow in the supply line 11 was, of course, unacceptable from a commercial standpoint because it impeded the intended sputtering process (in the chamber 14) by draining uncontrolled amounts of current, and eventually destroying the plastic connecting tube 70 due to high voltage, ion bombardment, and attendant heat build up in the tube 70.

PRIOR ART—(C) George Model C Machine

Referring to FIG. 8, the problems of feed-line glow described in the preceding paragraph were subsequently alleviated at least in part by employing a different form of glow suppression device 80 in the feed line, this construction being referred to herein as the George "Model C" machine and also constituting prior art with respect to this United States patent application. In particular, the device 80 consisted of a cylindrical plug 81 of resilient plastic material, such as is used in O-ring seals, inserted tightly into the upper end of the cathode inlet tube 47 and sealing the tube 47 at a point just below the fitting 73 and high-voltage connection. A capillary tube 82, such as a piece of hypodermic needle tubing, was pushed through and sealed within a small hole in the plug 81, to provide a low conductance path through the plug.

The gas-flow restriction caused by the capillary 82 caused the pressure in the plastic connecting tube 70, above the plane Y, to increase to a pressure sufficiently high so as to extinguish the glow that would otherwise occur in the tube 70. As discussed previously in the section "Theory of Operation," by thus raising the gas pressure in the region of the voltage drop X-Y to a sufficient level by a flow restricting device 80, glow suppression may be attained.

While this method of glow suppression has worked quite well in many applications, the technique leads to several problems:

1. It is fundamental to the nature of this method that a volume of gas must be captured at a relatively high pressure between the sputtering chamber (12, FIG. 1) and the gas controls 63. When a change in gas flow rate is made at the control point 63, there is a considerable time lag before the "stored" gasses are bled out and the change begins to take effect in the machine 13. The larger the stored volume and the higher the pressure, the longer the time lag between change and result.

2. The small diameter of the capillary 82 is easily plugged by particulare matter thus sometimes blocking the flow entirely.

3. The end (83) of the capillary tube 82 nearest the electrical ground (plane X) forms a needle point source of an electric field. This needle point enhances ionization and arcing. Such an arc will sometimes weld the end of the capillary closed, thus blocking the argon flow.

4. This method relies on a continuous flow of argon to maintain the elevated pressure in the tube 70 as long as there is a voltage on the cathode 12. During a machine shut down, if the argon flow is turned off before the voltage to the cathode 12 is turned off, the pressure in the tube can drop and allow a glow to be established. This glow may then destroy either the tube or the capillary.

Accordingly, the improved glow suppression device of FIGS. 2-3 was developed to solve the above problems, and especially to provide a glow-suppression device where there is substantially no pressure drop across the connecting tube 70 and where the gas in the feed line 11 (and tube 70) may be at low pressure, very close to the sputtering pressure.

In particular, in comparison with capillary type glow-suppression devices, the porous-insulator type device 10 has the following advantages:

1. Any volume of gas stored between it and the gas controls 63 can be held at a lower pressure than with a capillary type device, thus reducing the time lag between change and result.

2. There are a myriad of paths through the device (71) so it cannot be plugged by particulate matter.

3. There is no needle point source of an electric field to induce arcing.

4. There is no requirement to maintain any minimum pressure or flow rate of the argon in the tube 70 while the voltage is on to the cathode 12. Successful operation is independent of the pressure in the gas input tube 11, thus substantially widening the operating pressure range.

Cathode Cell 120—Second Embodiment

Referring now to FIGS. 9-14, a second embodiment of cathode cell 120 is illustrated, corresponding exactly to the cell 12 of FIGS. 1 and 2 so far as concerns the principles of the gas-feed system and use of a glow-suppression device 10 in accordance with the present invention. As illustrated in FIG. 9, the cell 120 is composed of a set of four separate hollow aluminum blocks or wedges 121—121, each having four flat facets on the outer surface 122, as viewed from the top in FIG. 9. The four wedges 121 are assembled together as shown in FIG. 9, so as to define a composite, four-piece central core member (121—121) for the cathode cell 120, corresponding in function to the cylindrical core 40 in FIGS. 1 and 2 except that separate polygonal blocks are used in this embodiment. When assembled, the flat outer surfaces or facets 122 define a regular sixteen-sided polygon, as viewed from the top, in which each corner 123 of the polygon corresponds to one of sixteen possible sputtering positions around the chamber 14, as described previously in connection with FIGS. 1 and 2 in the first embodiment.

Figure 10:
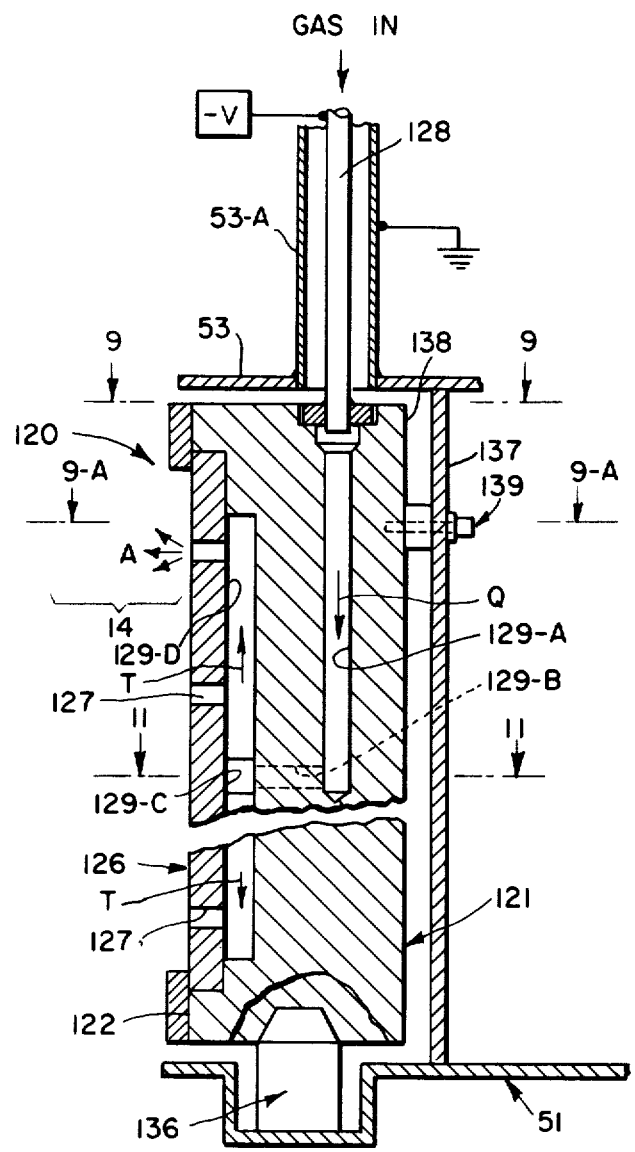
FIG. 10 is a vertical section through a portion of the cathode cell of FIG. 9, taken along line 10—10 of FIG. 9.

A set of four individual cathode plates 126 is provided, each of which is bolted to the periphery of a corresponding wedge 121, as shown in FIGS. 10-11 and the sectional portion of FIG. 9. The plates 126 constitute thin sheets of the metal to be sputtered, such as tantalum, and are bent at angles corresponding to the polygonal surface 122 of the wedges 121, so that the inner periphery of the cathode plates 126 is congruent to and fits tightly against the periphery 122 of the wedges 121; thus the cathode plates 126 and inner core wedges 121 form an integral cathode cell assembly similar in function to the core 40 and cathode ring 21 in FIGS. 1 and 2. The cathode plates are formed and positioned so that an end portion of each plate (such as 126-A, FIG. 9) overlaps an end corner 123-A of the corresponding wedge 121 and covers a portion of the periphery of an adjacent wedge 121.

The cathode plates 126 are also formed with a pattern of small gas-discharge apertures 127, located at the corners 123 and corresponding in layout and function to the apertures 22 in FIG. 1, for discharging sputtering gas into the chamber 14 as described earlier and as indicated by arrows A in FIGS. 9 and 10. The wedges 121 are provided with individual gas-inlet pipes 128 at the top (corresponding to the pipe 47 in FIG. 2), and the wedges are provided with a pattern of interconnected internal ducts 129, for transporting the gas from the inlet pipes 128 to all of the discharge apertures 127 in the cathode plates, generally as described in connection with the first embodiment.

The wedges 121 are also provided with individual cooling water inlet pipes 133 and outlet pipes 134 at the top, corresponding to the pipes 33-34 in FIG. 1, to circulate cooling water through separate passages (not shown) in the wedges 121, as is conventional in the art.

As illustrated in FIG. 10, the cathode cell assembly 120 is mounted on a bottom ground plane 51, an aluminum mounting plate, as in FIG. 1 embodiment. For this purpose, a plurality of insulating ceramic support members 136 (one shown in FIG. 10) are provided for mounting the cathode blocks 121 on the ground plane 51 in spaced relationship thereto. A top ground plane 53 is provided at the top as in the first embodiment, for shielding the top surfaces of the cathode cell 12, and a tubular ground sheath 53-A for shielding the pipes such as 128.

A set of four inner ground planes 137 are mounted to the top and bottom ground planes 53-51 in spaced relationship to the inner surfaces (138) of the wedges 121, which define a square central aperture as illustrated in FIG. 9. The inner ground planes 137 are also fastened to the adjacent inner surfaces (138) of the wedges 121 by insulating fasteners 139, one of which is shown in FIG. 10.

Referring to FIGS. 10, 11 and 12, the layout of the gas-transmission ducts 129 in the cathode blocks 121 is illustrated. The gas comes in at the top, from the inlet pipe 128, and advances downward through a vertical passage 129-A (arrow Q) in the center of the block; thence forward to the front faces (122) of the block through a pair of branched horizontal passages 129-B (arrows R); thence along the periphery of the front face of the block via a horizontal groove 129-C (arrows S) formed along the front face; thence up and down along vertical channels 129-D (arrows T) formed in the periphery of the block along the corners 123 in alignment with the discharge apertures 127 of the adjacent cathode plate 126. (In FIG. 12, the positions of the discharge apertures 127 are designated by small "s's.") An additional set of four horizontal channels 129-E (FIG. 12) carry the gas to a last set of four apertures (127) off the page to the right in FIG. 12, as indicated by arrows U.

Figure 13:
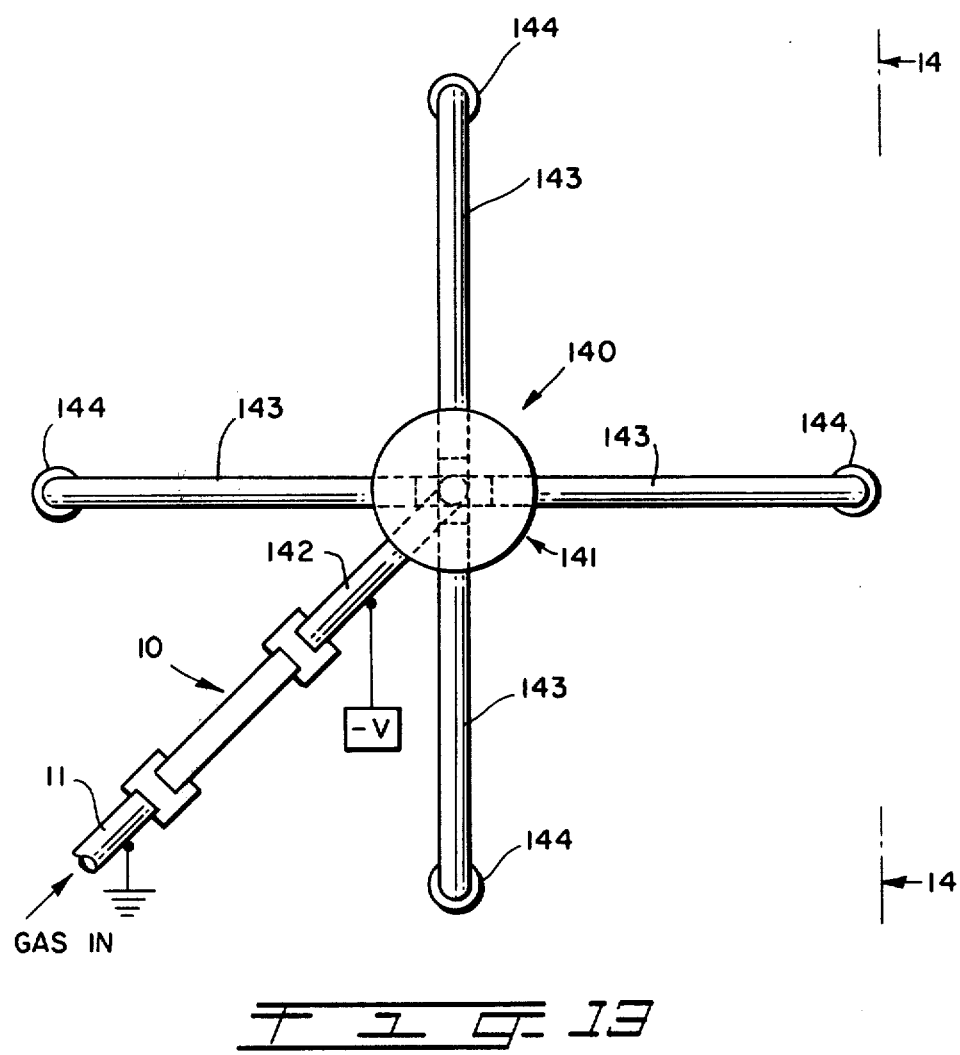
FIG. 13 is a top view of a gas-distribution system for the cathode cell of FIGS. 9–10.
Figure 14:
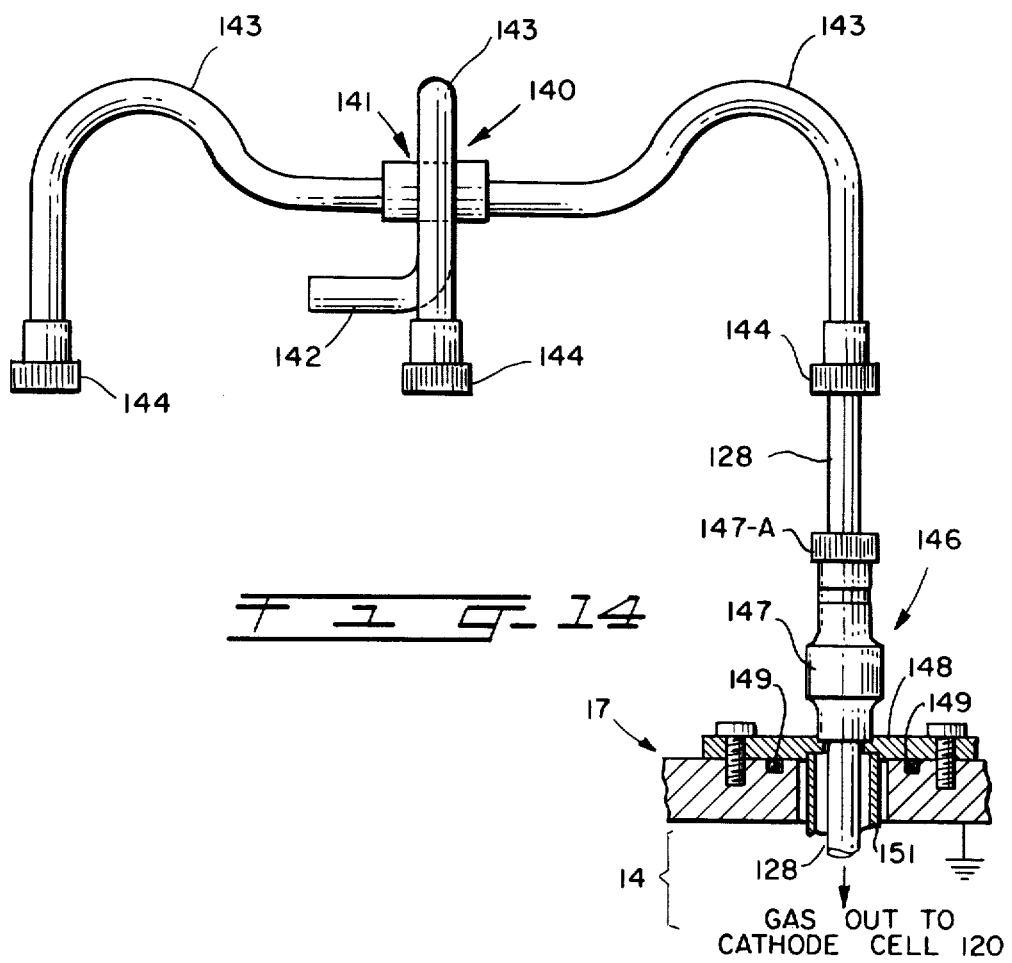
FIG. 14 is a right-side view of the gas system of FIG. 13, viewed along line 14—14 of FIG. 13 and showing the physical connection of the gas supply system to the top of the sputtering chamber.

FIGS. 13-14 illustrate a system 140 for feeding the sputtering gas from an input supply line 11 (corresponding to the one shown in FIGS. 1-2) to the four gas-inlet pipes 128 (FIGS. 9-10) at the top of the cathode cell blocks 121. The system 140 includes a branched distribution line or spider 141, having an input pipe 142 connected to the grounded supply line 11 via a glow-suppression device 10 of the type described previously in connection with FIGS. 2–3. As in the previous embodiment, a source of cathode potential (−V) is connected to the input pipe 142 as indicated schematically in FIG. 13.

The spider further includes four branch feeder lines 143 arranged at right angles to each other as shown in FIGS. 13–14, for conveying the gas outward from the input pipe 142 at the center to a set of four fittings 144 arranged in alignment above and connected to the four cell input pipes 128. The four pipes 128 pass through a set of four insulating vacuum feed throughs 146, one of which is shown in FIG. 14, mounted to the top support plate 17 of the sputtering machine. Each vacuum feed through 146 includes a ceramic insulation sleeve 147, through which the gas inlet pipe 128 passes to a connection with the branch pipe 143 at the fitting 144, via a vacuum seal 147-A.

The sleeve 147 is secured to a metal plate 148, which is mounted on vacuum seals 149 to the top of the top plate 17, and serves to insulate the grounded top plate 17 from the charged gas line 128, while permitting the gas line to enter the vacuum chamber 14. An additional tubular ground shield or sleeve 151 is connected to the plate 148 and surrounds the gas input pipe 128 so as to shield the exterior surface of the pipe 128, as previously described. The ground sleeve 151 is concentric to the one 53-A shown at the top of FIG. 10.

Equivalents

While various specific embodiments and examples of the invention, and of sputtering systems and equipment with which the invention may be used, have been described in detail herein, it should be apparent that various modifications may be made from the specific details described, without departing from the spirit and scope of the invention.

What is claimed is:

1. A method of transporting an ionizable gas or mixture of gasses across a potential voltage difference under circumstances where the gas would otherwise tend to support a sputtering glow, which comprises:
passing the gas through a passage in an electrically insulating member, the potential voltage difference existing across the passage, the passage being packed with a porous electrically insulating material arranged so as to suppress sputtering glow in the member.

2. A method as recited in claim 1, wherein the insulating material comprises strands of fiberglass insulation packed into the passage.

3. A method as recited in claim 1 or claim 2, wherein the insulating member comprises a plastic, glass, or ceramic tube.

4. A method as recited in claim 3, wherein the gas comprises argon or a mixture of argon and nitrogen, or argon and oxygen.

5. A method as recited in claim 1 or claim 2, wherein the insulating material is further arranged so that there is no appreciable pressure drop across the insulating member.

6. In a sputtering process of the type wherein a sputtering gas is advanced from a supply line at ground potential to a cathode cell at high negative potential and low absolute pressure, an improved method of suppressing glow discharge in the supply line, which comprises:
passing the gas through an insulating tube located between the grounded supply line and the cathode cell, so that a voltage drop exists between the ends of the tube, the tube being packed with a porous insulating medium arranged to suppress sputtering glow in the tube.

7. A method as recited in claim 6, wherein the insulating medium is so arranged that there is no appreciable pressure drop across the insulating member.

8. A method as recited in claim 6 or claim 7, wherein the insulating medium comprises strands of fiberglass insulation packed into the tube.

9. A method as recited in claim 8, wherein the gas comprises argon or a mixture of argon and nitrogen, or argon and oxygen.

10. A glow-suppression device, for suppressing sputtering glow in an ionizable gas to be transported across a voltage drop under sputtering conditions, which comprises:
an insulating member having a passage therein; means for passing the gas through the passage; and means for applying a voltage drop across the passage, the passage being packed with porous insulating means for suppressing sputtering glow in the member.

11. A glow-suppression device as recited in claim 10, wherein the insulating means comprises strands of fiberglass insulation packed into the passage.

12. A glow-suppression device as recited in claim 10 or claim 11, wherein the insulating member comprises a plastic, glass, or ceramic tube.

13. A glow-suppression device as recited in claim 12, wherein the porous insulating means is further arranged for transporting the gas with no appreciable pressure drop across the insulating member.

14. A glow-suppression device as recited in claim 13, wherein the gas comprises argon or a mixture of argon and nitrogen, or argon and oxygen.

15. In combination with a sputtering machine of the type wherein a sputtering gas is advanced from a grounded supply line to a cathode input line connected to a cathode cell at high negative potential and low absolute pressure, an improved glow-suppression device which comprises:
an insulating tube connected between the grounded supply line and the cathode input line, the tube being packed with porous insulating means for suppressing sputtering glow in the tube in the region of voltage drop between the grounded supply line and the cathode input line.

16. A combination as recited in claim 15, wherein the insulating means comprises strands of fiberglass packed into the tube, and arranged so that there is no appreciable pressure drop across the tube.

17. A combination as recited in claim 16, wherein the sputtering gas comprises argon or argon mixed with a reactive gas.

18. A cathode-cell assembly for a sputtering machine of the type in which a cathode cell assembly is mounted centrally within an evacuated sputtering chamber facing workpieces to be sputtered, which comprises:
(a) a core member adapted to be mounted in the chamber in electrically insulated relationship to the chamber walls, the core member having gas-transmission ducts for conveying a sputtering gas through the core member to a plurality of gas-discharge locations located at spaced intervals around the periphery of the core member;

(b) a cathode sheet composed of the material to be sputtered and secured to those portions of the periphery of the core member where sputtering is desired, the cathode sheet having a plurality of gas-discharge apertures communicating with the ducts, for permitting discharge of the sputtering gas into the chamber at desired sputtering locations;

(c) a metal gas input pipe connected to the core member and in communication with the ducts, the inlet pipe being adapted, upon assembly in the sputtering machine, to extend outside of the sputtering chamber and to be connected to a source of sputtering potential;

(d) a plastic tube having one end connected to the input pipe, the tube being packed with strands of fiberglass; and (e) means for supplying a sputtering gas to the plastic tube, the supply means including a grounded metal supply line connected to the other end of the tube, the fiberglass strands being packed in the tube with such density and the tube being of such length that the strands suppress sputtering glow in the gas across the voltage drop region between the grounded supply line and the cathodically charged cathode-cell input pipe.

* * * * *